(12) United States Patent
Schelling et al.

(10) Patent No.: US 10,000,374 B2
(45) Date of Patent: Jun. 19, 2018

(54) MEMS COMPONENT

(71) Applicant: Robert Bosch GmbH, Stuttgart (DE)

(72) Inventors: Christoph Schelling, Stuttgart (DE); Benedikt Stein, Stuttgart (DE); Michael Stumber, Korntal-Muenchingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days. days.

(21) Appl. No.: 15/506,068

(22) PCT Filed: Jun. 23, 2015

(86) PCT No.: PCT/EP2015/064042
§ 371 (c)(1),
(2) Date: Feb. 23, 2017

(87) PCT Pub. No.: WO2016/030040
PCT Pub. Date: Mar. 3, 2016

(65) Prior Publication Data
US 2017/0247246 A1    Aug. 31, 2017

(30) Foreign Application Priority Data

Aug. 28, 2014  (DE) .................. 10 2014 217 152

(51) Int. Cl.
*H01L 29/84* (2006.01)
*B81B 3/00* (2006.01)

(52) U.S. Cl.
CPC ........ *B81B 3/0086* (2013.01); *B81B 2201/01* (2013.01); *B81B 2201/0228* (2013.01); *B81B 2201/0257* (2013.01); *B81B 2201/0264* (2013.01); *B81B 2203/0127* (2013.01); *B81B 2203/0136* (2013.01)

(58) Field of Classification Search
CPC .... B81B 2201/0264; B81B 2203/0127; B81B 2203/0136
See application file for complete search history.

(56) References Cited

U.S. PATENT DOCUMENTS 6,906,905 B1  6/2005  Chinthakindi
2002/0067663 A1* 6/2002  Loeppert ............... B81B 3/0072
367/181

(Continued)

FOREIGN PATENT DOCUMENTS

DE  102013217312 A1  3/2015
WO  2013006151 A2  1/2013

OTHER PUBLICATIONS

International Search Report dated Oct. 9, 2015, of the corresponding International Application PCT/EP2015/064042 filed Jun. 23, 2015.

*Primary Examiner* — Syed Gheyas
(74) *Attorney, Agent, or Firm* — Norton Rose Fulbright US LLP; Gerard Messina

(57) ABSTRACT

A layer material which is particularly suitable for the realization of self-supporting structural elements having an electrode in the layer structure of a MEMS component. The self-supporting structural element is at least partially made up of a silicon carbonitride ($Si_{1-x-y}C_xN_y$)-based layer.

7 Claims, 6 Drawing Sheets

(56) References Cited

U.S. PATENT DOCUMENTS

| | | | |
|---|---|---|---|
| 2002/0181725 A1* | 12/2002 | Johannsen | B82Y 30/00 381/174 |
| 2009/0116675 A1* | 5/2009 | Miyoshi | B81B 3/0072 381/369 |
| 2015/0008543 A1* | 1/2015 | Hong | B81B 3/0021 257/417 |
| 2015/0014797 A1* | 1/2015 | Schelling | B81B 3/0059 257/416 |
| 2015/0063608 A1* | 3/2015 | Schelling | H04R 19/005 381/174 |

* cited by examiner

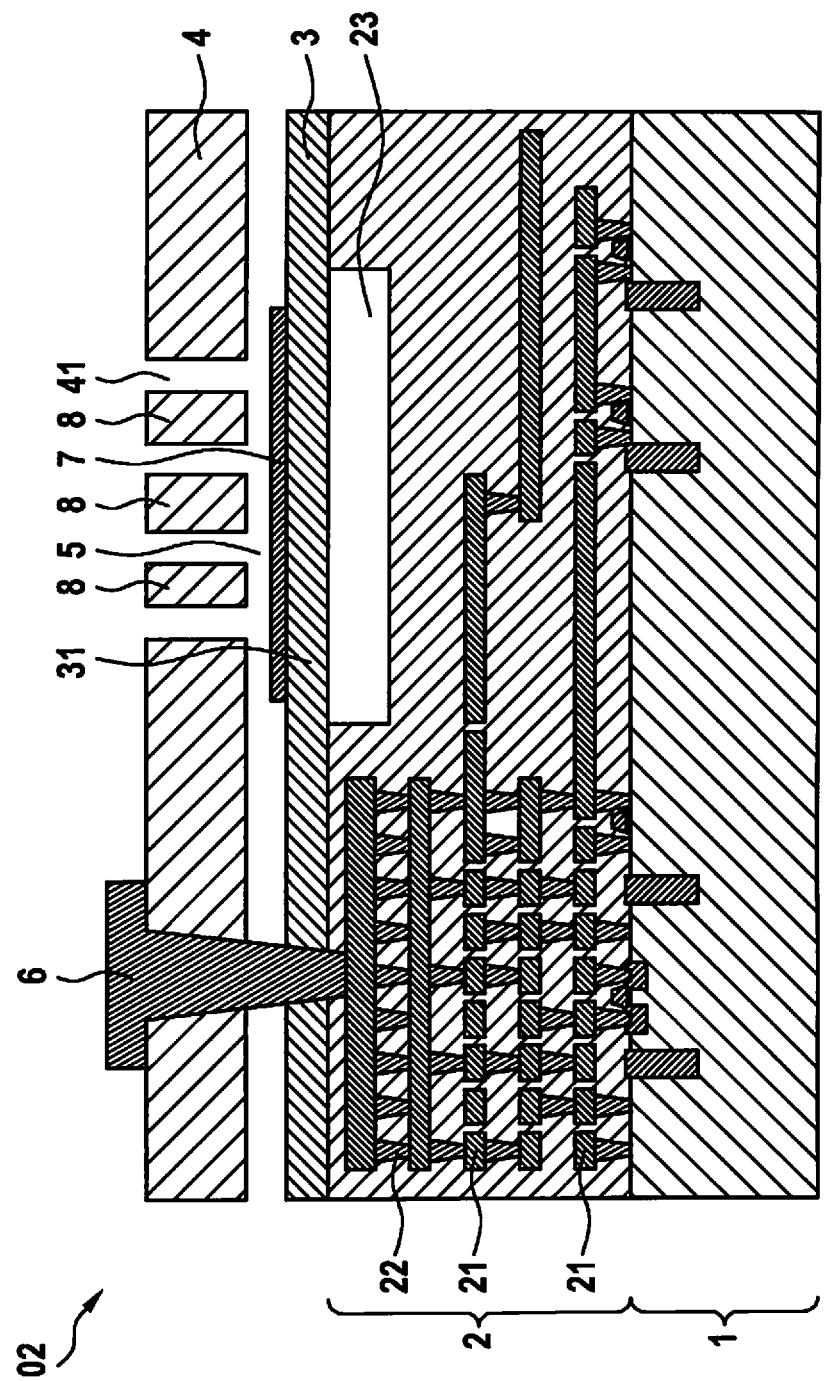

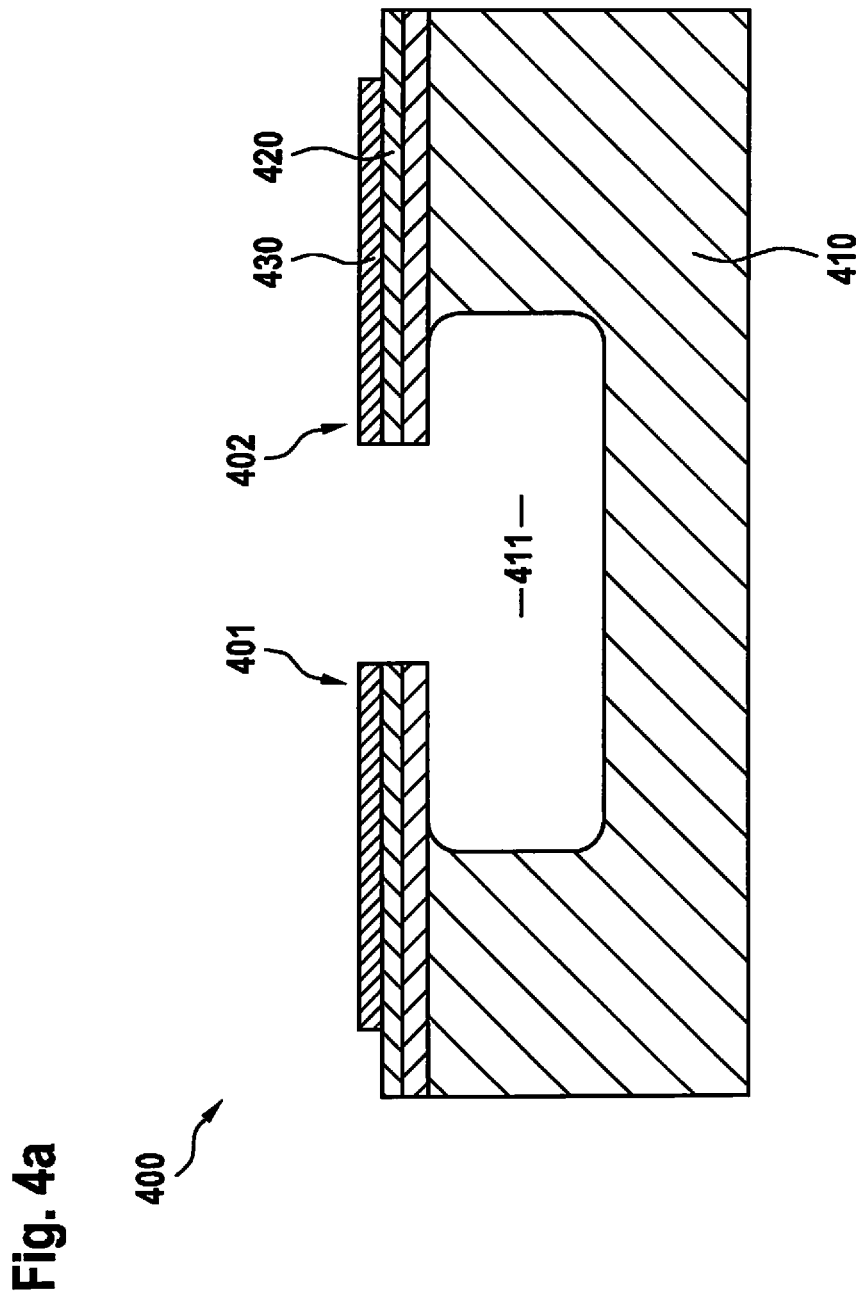

MEMS COMPONENT

BACKGROUND INFORMATION

In general terms, the present invention relates to MEMS components in whose layer structure at least one self-supporting structural element having at least one electrode is realized.

The self-supporting structural element may be a micromechanical component which has its own sensor or actuator functionality, for instance the diaphragm of a pressure sensor, a microphone or an amplifier. However, the self-supporting structural element may also serve simply as a carrier for a sensor functionality, for instance in the case of a flow-rate sensor having heating resistors which are present on a diaphragm for the thermal decoupling. Accordingly, the electrode of the self-supporting structural element may be utilized as a capacitor electrode for acquiring measuring signals or for the excitation of vibrations or also simply for the electrical contacting of an electrical resistor or some other circuit component. In all cases, leakage currents between the electrode and the abutting carrier material of the structural element have a detrimental effect on the component function.

The micromechanical structure of MEMS components is usually realized in the form of a layer structure which is the result of a sequence of layer depositing processes and structuring processes. Self-supporting structures are produced either in a back-etching process or within the framework of front-side processing in a sacrificial-layer etching process. In both cases, the use of an etch-stop layer for the physical restriction of the etching process is advantageous. This allows for the realization of structural elements of a specifiable defined geometry and more specifically, also the realization of very thin-walled structural elements such as diaphragms and bending beams.

The self-supporting structural element should be developed in one layer or in multiple layers whose mechanical properties correspond to or accommodate the function of the structural element. For instance, a self-supporting structural element that is to be used as a sensor or microphone diaphragm should be as thin and elastic as possible, while the stationary counterelement of a microphone structure must have the highest rigidity possible.

SUMMARY

The present invention provides a layer material that is especially suitable for the realization of self-supporting MEMS structural elements including an electrode.

According to the present invention, the self-supporting structural element should at least regionally be made of a layer based on silicon carbonitride ($Si_{1-x-y}C_xN_y$).

Silicon carbonitride has a very high specific resistance, that is to say, has a high electrical insulating effect, so that leakage currents between the electrode on the structural element and the abutting semiconductor material of the MEMS component are effectively prevented. In addition, silicon carbonitride is chemically largely inert. As a minimum, it is not significantly attacked by the etching media commonly used during the silicon-oxide sacrificial layer etching such as HF. For example, the etch rate of silicon carbonitride in the HF-vapor phase is less than 0.2 nm/min. For this reason silicon carbonitride is very suitable as an etch-stop material for the conventional sacrificial-layer etching processes.

The mechanical layer properties of a layer based on silicon-carbonitride ($Si_{1-x-y}C_xN_y$) depend on their material composition, i.e., on the proportions of the individual material components silicon Si, carbon C and nitrogen N, but also on possible further material components. Accordingly, certain layer properties such as the mechanical tension are easily variable and adaptable to the respective function of the self-supporting structural element.

In addition, it is advantageous that silicon carbonitride-based layers are easily able to be produced with the aid of standard deposition methods such as in an LPCVD (low pressure chemical vapor deposition) method at temperatures in the range from 700-900° C. As an alternative, such layers are also able to be deposited in a PECVD (plasma enhanced chemical vapor deposition) process at 300-800° C. In this context, silane $SiH_4$, methane $CH_4$ or ammonia $NH_3$ may be used as starting gases. Standard methods such as DRIE (deep reactive ion etching) using SF6 are also able to be used for the structuring of layers based on silicon carbonitride.

Especially suitable for the realization of self-supporting structural elements are layer compositions that have a 40-55 at % Si content, a 5-40 at % C content, and a 55-5 at % N content.

Layers having this composition exhibit slight tensile tensioning and high breaking tension which therefore makes them mechanically very robust as a whole.

The tensioning state of silicon carbonitridoboride layers $Si_{1-x-y-z}C_xN_yB_z$ with x, y, z>1% is particularly easy to adjust. A layer composition having a 35 at % Si content, 35 at % C content, 20 at % N content and 10 at % B content is advantageous.

Since they are electrically highly insulating, silicon carbonitride-based layers are especially suitable as carriers for electrodes of capacitor systems. In this case, at least one further electrode is developed in the layer structure of the MEMS component, which forms a capacitor system together with the electrode of the self-supporting structural element. If at least one of the two electrodes of the capacitor system is supported so as to allow it to move, then such a capacitor system is advantageously able to be used for signal sensing or the excitation of vibrations, depending on the function of the MEMS component. The self-supporting structural element may be used both as carrier or suspension of the movable electrode of the capacitor system and as stationary carrier or stationary connection for at least one electrode of the capacitor system.

Of special importance is the use of such capacitor systems for the signal detection in the case of pressure-sensor and microphone components. Here, the pressure-sensor diaphragm or the microphone diaphragm is advantageously developed as a self-supporting structural element in a layer based on silicon carbonitride and provided with an electrode. The counter electrode of the capacitor system is frequently situated on a stationary counterelement of the MEMS layer structure. This counterelement is also able to be realized as a self-supporting structured element in a layer based on silicon carbonitride.

Bending beams with electrodes for detecting measuring signals or for an excitation should be mentioned as a further use of the present invention that is of importance for the realization of MEMS components having a sensor and/or actuator functionality. Such bending beams, for example, are used within the framework of inertial sensors or also as micromechanical switch.

BRIEF DESCRIPTION OF THE DRAWINGS

There are various possibilities of embodying and further developing the present invention in an advantageous manner. In this context reference is made to the description below of a plurality of exemplary embodiments of the present invention with the aid of the figures.

FIGS. 1a, 1b shows a respective schematic sectional view of a capacitive MEMS pressure-sensor element 101 and 102.

FIGS. 4a, 4b shows a schematic sectional view and a plan view of a further capacitive sensor element 400.

DETAILED DESCRIPTION OF EXAMPLE EMBODIMENTS

Figure 1A:
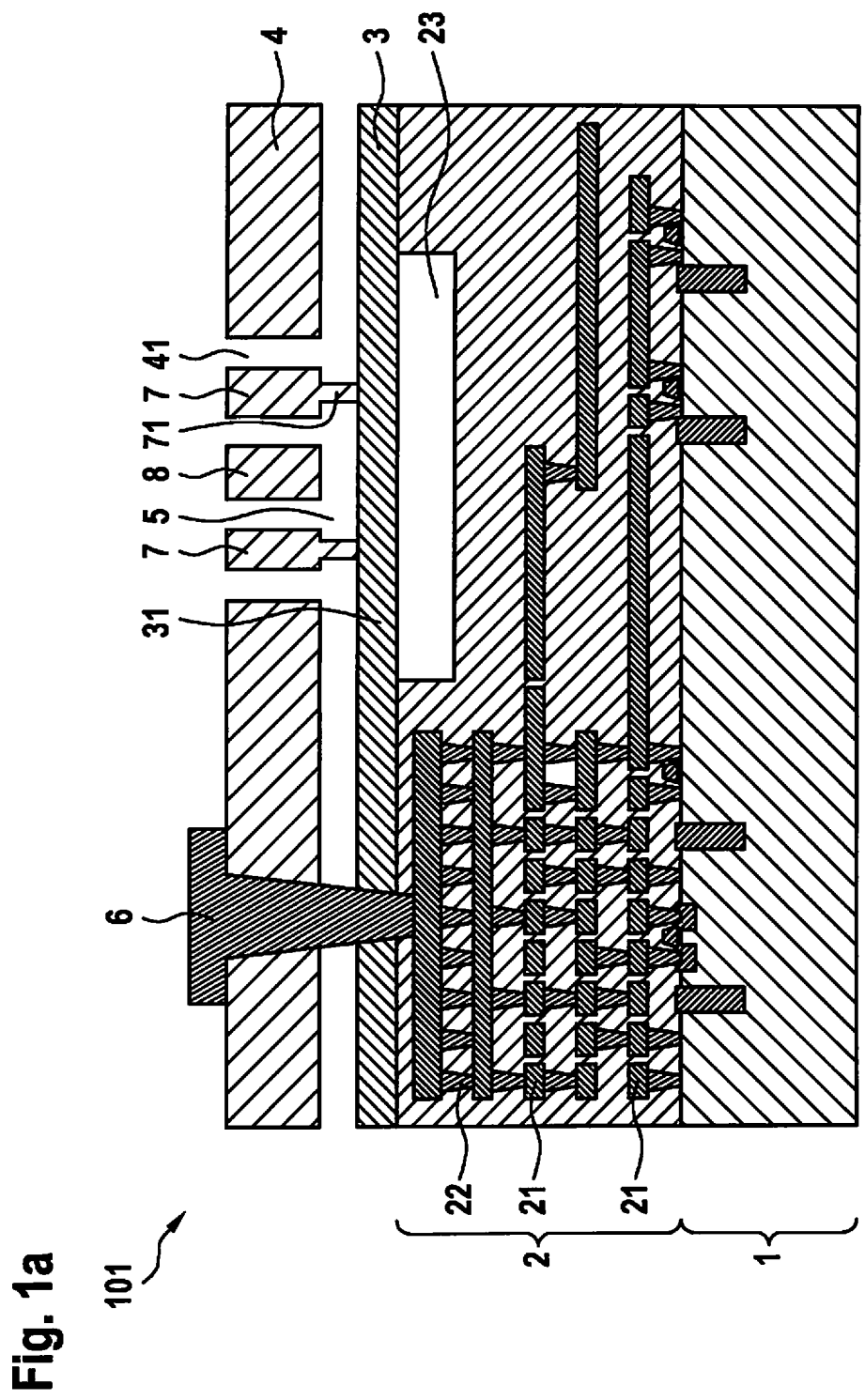

The layer structure of the two components 101 and 102 shown in FIGS. 1a and 1b is based on a respective CMOS substrate 1 into which circuit functionalities (not shown here in detail) are integrated. They are connected to each other via a back-end stack 2 having multiple wiring planes 21 and through contacts 22 between wiring planes 21 and are electrically contactable. In the exemplary embodiment shown, the electrical contacting takes place by way of a through contact 6, which extends from the front side of the component to the uppermost wiring plane of back-end stack 2.

Situated on back-end stack 2 is a relatively thin layer 3 based on silicon carbonitride in which a self-supporting pressure diaphragm 31 is developed. It spans a cavity 23 in back-end stack 2. The layer structure of components 101 and 102 furthermore includes a relatively thick functional layer 4, which is structured in the region above pressure diaphragm 31. Functional layer 4 was provided with through holes 41 here for the pressure application of pressure diaphragm 31, which terminate in a cavity 5 between pressure diaphragm 31 and functional layer 4.

To produce the component structures shown in FIGS. 1a and 1b, a silicon-oxide sacrificial layer was produced on layer 3 based on silicon carbonitride, and structured in the case of component 101, before functional layer 4 was deposited. Only after functional layer 4 had been structured was pressure diaphragm 31 exposed by removing the sacrificial-layer material again in an HF vapor-phase etching process via through holes 41 in functional layer 4. Layer 3 based on silicon carbonitride was not attacked in the process. It acted as etch stop and as passivation for back-end stack 2 in this sacrificial-layer etching process.

Both in the case of component 101 and of component 102, the deflections of pressure diaphragm 31 are detected in a capacitive manner with the aid of one or more electrode(s) 7, which are deflected together with pressure diaphragm 31, and one or more stationary counter electrode(s) 8.

In the case of component 101 shown in FIG. 1a, both the deflectable electrodes 7 and stationary electrodes 8 are developed in functional layer 4. Deflectable electrodes 7 are mechanically connected to pressure diaphragm 31 on account of the structuring of the sacrificial layer, i.e., via webs 71, whereas they are released therefrom as a result of the structuring of functional layer 4. In contrast, stationary electrodes 8 are linked to functional layer 4. The very high specific resistance of layer 3 based on silicon carbonitride prevents the occurrence of leakage currents between deflectable electrodes 7 and the layer structure of component 101.

In the case of component 102 shown in FIG. 1b, only stationary electrodes 8 are developed in functional layer 4. Deflectable electrode 7 is realized in the form of a metallization of pressure diaphragm 31 in this instance. Here, too, the very high specific resistance of layer 3 based on silicon carbonitride prevents the occurrence of leakage currents between deflectable electrodes 7 and the layer structure of component 102.

Figure 2:
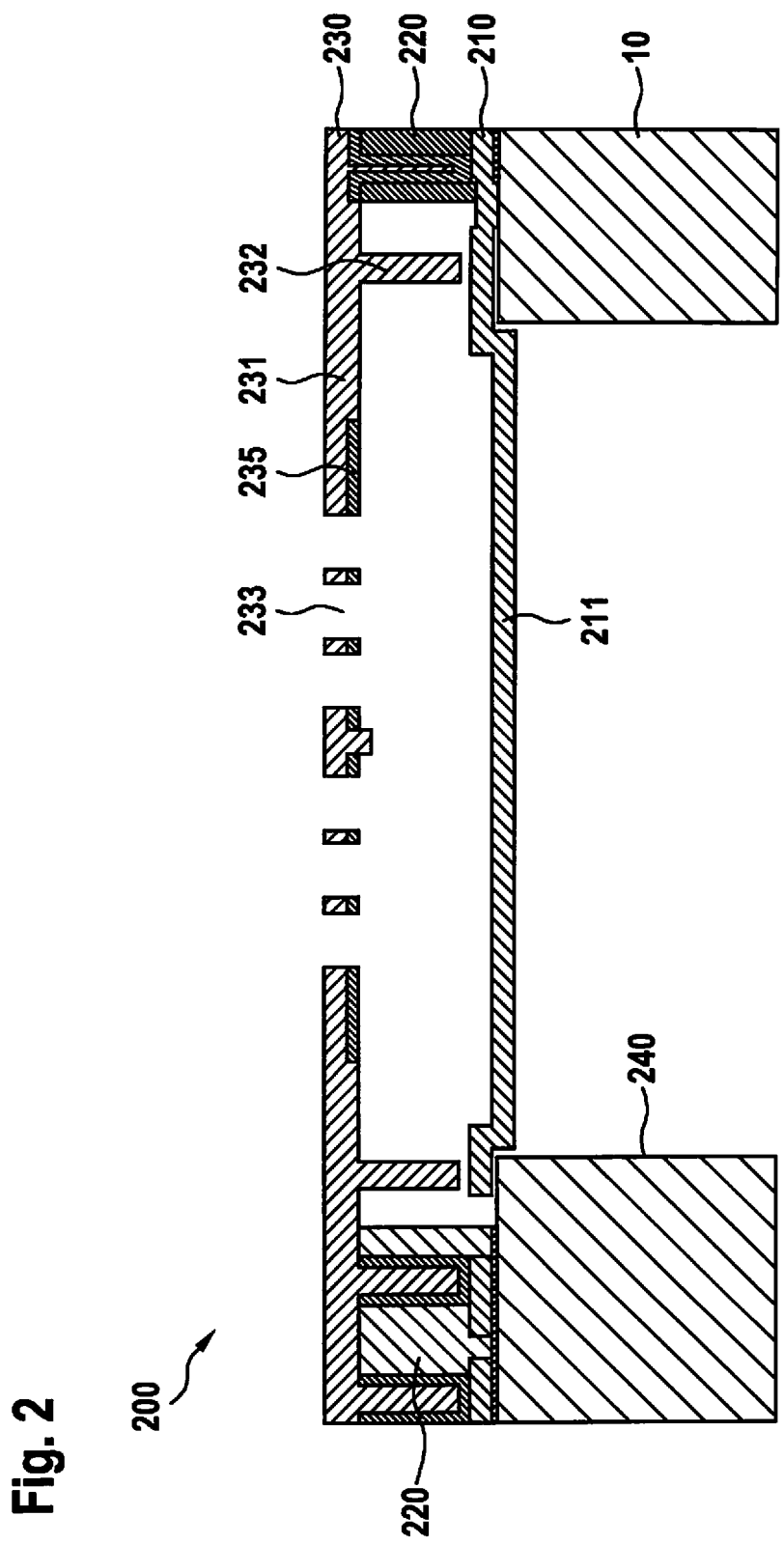
FIG. 2 shows a schematic sectional view of a capacitive MEMS microphone component 200.

In contrast to the two pressure-sensor elements 101 and 102 described above, in microphone component 200 shown in FIG. 2 it is not microphone diaphragm 211 but rather stationary element 231 that is developed in a layer 230 based on silicon carbonitride.

Microphone diaphragm 211 of component 200 is realized in a thin poly-silicon layer 210 on component substrate 10. It spans an opening 240 in the rear side of the component. To produce the microphone structure, a silicon-oxide sacrificial layer 220 was produced above poly-silicon diaphragm layer 210, whose thickness defines the clearance between microphone diaphragm 211 and counterelement 231. This sacrificial layer 220 was structured above the edge region of microphone diaphragm 211 in order to create mechanical stops 232 for restricting the diaphragm deflection. The sacrificial layer above the center region of microphone diaphragm 211 was not structured. An electrically conductive layer 235, such as a doped poly-silicon layer or a metallization, was deposited on this closed layer region and structured. A relatively thick silicon carbonitride-based layer 230 was then deposited on top of sacrificial layer 220 structured and coated in this manner and structured. In the process, through holes 233 were created in the region above microphone diaphragm 211, which also extend through electrically conductive layer 235.

Microphone diaphragm 211 and counterelement 231 were exposed only subsequent to this structuring process by removing the material of the sacrificial layer again in a HF vapor-phase etching process via through holes 233 in layer 230 based on silicon carbonitride. In so doing, mechanical stops 232 in the edge region of counterelement 231 were exposed too, since the material of silicon carbonitride-based layer 230 was not attacked during the sacrificial layer etching process.

Depending on the mounting of component 200, the sound-pressure application of microphone diaphragm 211 may take place either via rear-side opening 240 in component substrate 10 or also via through holes 233 in counterelement 231. The deflections of microphone diaphragm 211 are converted into electrical signals with the aid of a microphone-capacitor system. Here, poly-silicon microphone diaphragm 211 functions as deflectable electrode of this microphone capacitor and cooperates with a counter electrode which is developed in conductive layer 235 on the underside of self-supporting counterelement 231. Since counterelement 231 is acoustically permeable on account of through holes 233, the position of counter electrode 235 is fixed in relation to microphone diaphragm 211.

Figure 3:
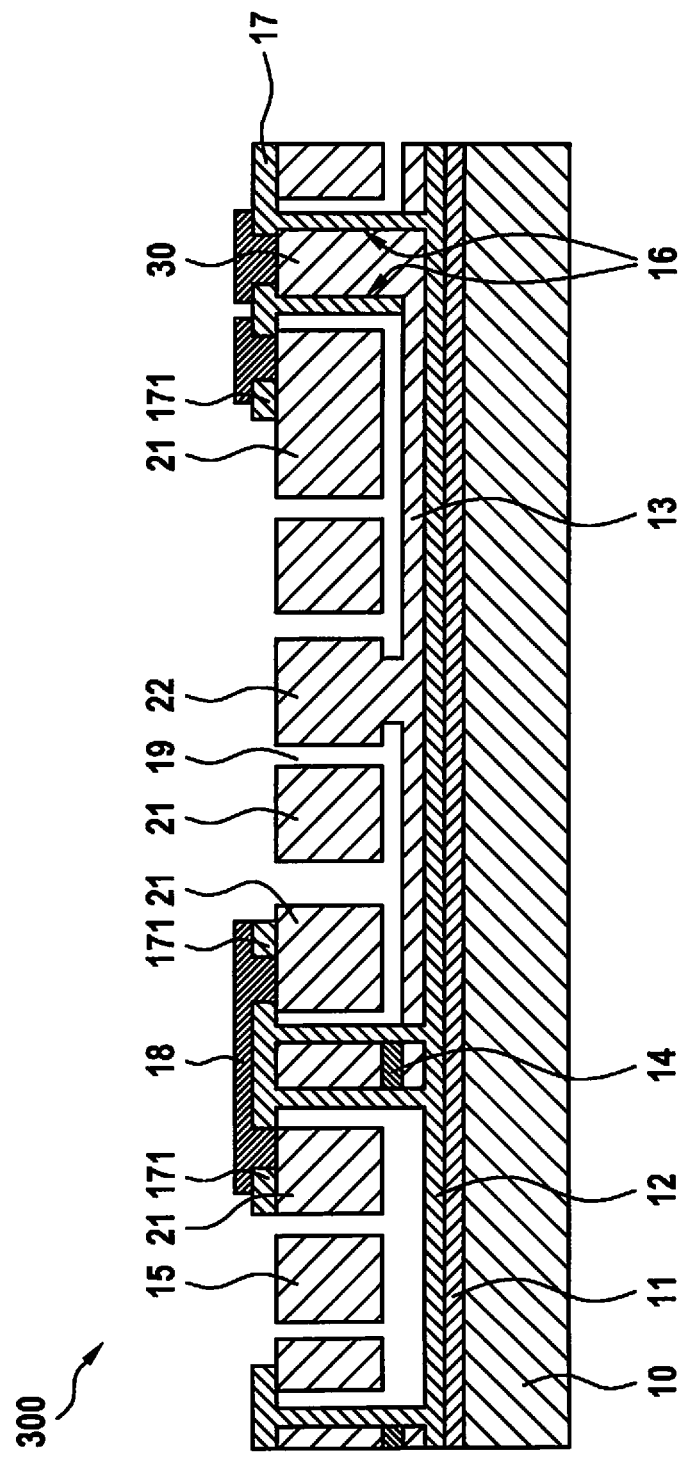
FIG. 3 shows a schematic sectional view of a capacitive MEMS inertial sensor element 300.

The sensor structure of component 300 shown in FIG. 3 is also realized in a layer structure on a silicon substrate 10. In the process the substrate surface was first provided with a silicon-oxide passivation 11 on which a first silicon carbonitride layer 12 was then deposited. The electrical contacting of the sensor structure takes place via a wiring layer 13 that was applied on silicon carbonitride layer 12 and structured in a suitable manner. In the exemplary embodiment described here, this is a thin, doped poly-silicon layer 13. However, the electrical contacting of the sensor structure could also be realized in the form of a metallization. Then, a silicon-oxide sacrificial layer 14 was deposited on structured wiring layer 13 and structured. In the process, sacrificial layer 14 was opened up in the region of a stationary electrode 22 and a through contact 30 via which wiring layer 13 is able to be contacted. A thick functional layer 15 as micromechanical functional layer was deposited on top thereof. In a first structuring process, first trenches 16 were created, which extend across entire functional layer 15 and partly also across entire sacrificial layer 14 and wiring layer 13 down to silicon carbonitride layer 12. Then, a further silicon carbonitride layer 17 was deposited on functional layer 15 thus structured, and trenches 16 were filled in the process. In this way, individual regions in functional layer 15 were electrically decoupled such as through contact 30. Silicon carbonitride layer 17 was then also provided with a metallization 18 in which circuit traces and connection pads were developed. Only then was silicon carbonitride layer 17 removed again at least regionally from the surface of functional layer 15 in order to create further trenches 19 for the definition of the sensor structure in these layer regions. Individual layer regions 21 and 22 of functional layer 15 were mechanically and also electrically decoupled in the process.

The sensor structure thus defined is finally exposed in a sacrificial-layer etching process, during which the sacrificial-layer material underneath functional layer 15 was at least regionally removed via trenches 19. Silicon carbonitride layer 17 and filled trenches 16 acted as etch stop during this etching process.

The sensor structure thus produced includes a plurality of seismic masses 21, which are developed in functional layer 15 and are linked via self-supporting structural elements 171 in silicon carbonitride layer 17 to the layer structure so that they are deflectable in the layer plane, that is to say, laterally. These seismic masses 21 function as deflectable electrodes of a capacitor system for the acquisition of measured values. Stationary counter electrodes 22 of this capacitor system are likewise developed in functional layer 15 and connected both mechanically and electrically to wiring layer 13.

Figure 4B:
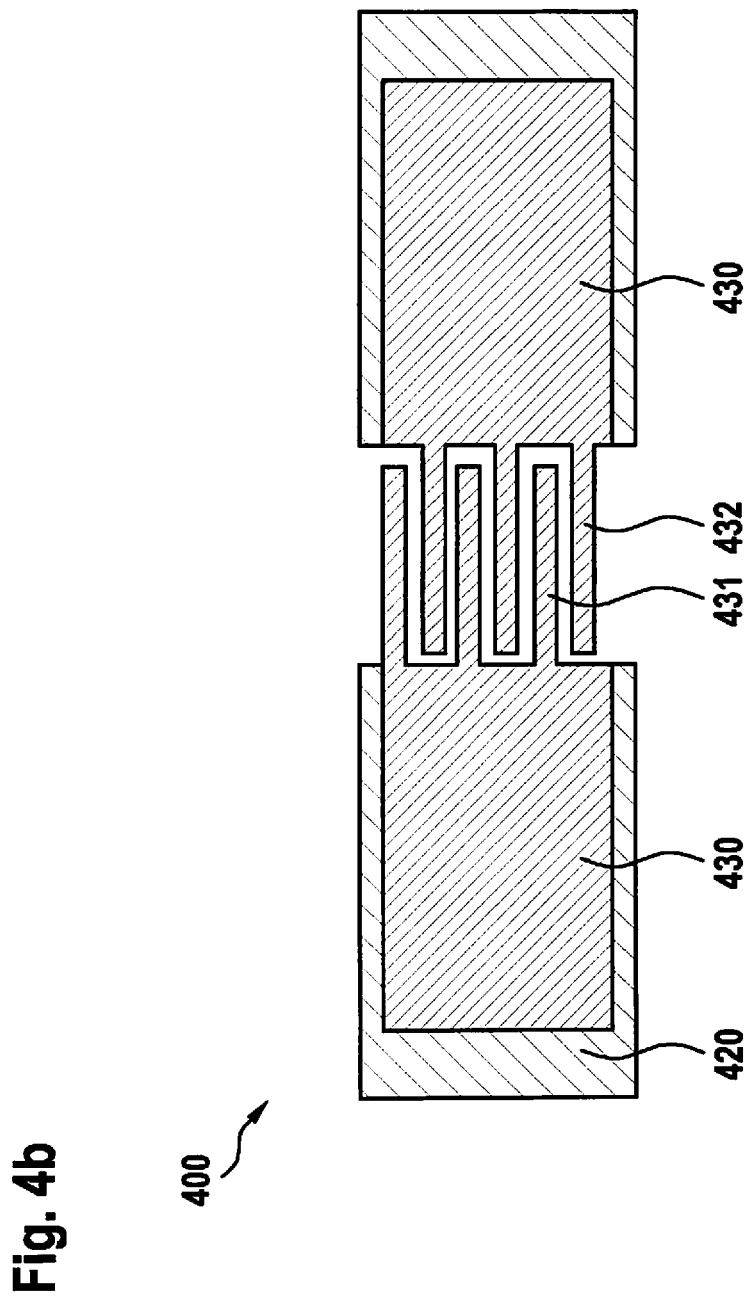

The sensor structure of component 400 shown in FIG. 4 includes two bending-beam systems which mesh with one another in the form of a comb and respectively include three self-supporting bending beams 401 and 402, which are developed in a layer structure on a component substrate 410 and extend beyond a cavity 411 in substrate 410. The layer structure is made up of a plurality of layers which are not described here in greater detail, and is sealed by a silicon carbonitride layer 420 having a metallization 430. Two interdigital electrodes 431 and 432 are developed in metallization 430 according to the form of the two bending-beam systems, which jointly form a measuring-capacitor system for detecting lateral deflections of the bending-beam systems.

What is claimed is:

1. A MEMS component, comprising:
a layer structure in which at least one self-supporting structural element having at least one electrode is realized, the self-supporting structural element being at least partially made up of a layer based on silicon carbonitride ($Si_{1-x-y}C_xN_y$), and at least one further electrode being developed in the layer structure, which forms a capacitor together with the electrode of the self-supporting structural element, wherein at least one of the two electrodes of the capacitor is supported so as to allow it to move, wherein the self-supporting structural element is a stationary carrier of the electrode of the self-supporting structural element, wherein the electrode of the self-supporting structural element is electrically conductive and is formed by depositing and structuring, on the self-supporting structural element, one of a doped polysilicon layer or a metallization.

2. The MEMS component as recited in claim 1, wherein the silicon carbonitride-based layer of the self-supporting structural element includes 40-55 at % Si content, 5-40 at % C content and 55-5 at % N content.

3. The MEMS component as recited in claim 1, wherein the layer structure further includes a second self-supporting structural element at least partially made up of a layer based on silicon carbonitride ($Si_{1-x-y}C_xN_y$), and wherein the second self-supporting structure element is used as a carrier for the movable electrode of the capacitor system.

4. The MEMS component as recited in claim 1, wherein the layer structure further includes a second self-supporting structural element at least partially made up of a layer based on silicon carbonitride ($Si_{1-x-y}C_xN_y$), and wherein the second self-supporting structure element is one of a pressure-sensor diaphragm or a microphone diaphragm.

5. The MEMS component as recited in claim 1, wherein the layer structure further includes a second self-supporting structural element at least partially made up of a layer based on silicon carbonitride ($Si_{1-x-y}C_xN_y$), and wherein the second self-supporting structure element is a bending beam.

6. A MEMS component, comprising:
a layer structure in which at least one self-supporting structural element having at least one electrode is realized, the self-supporting structural element being at least partially made up of a layer based on silicon carbonitride ($Si_{1-x-y}C_xN_y$), and at least one further electrode being developed in the layer structure, which forms a capacitor system together with the electrode of the self-supporting structural element, wherein at least one of the two electrodes of the capacitor system is supported so as to allow it to move, wherein the self-supporting structural element is used one of as a stationary carrier or stationary connection, for of at least one of the electrodes of the capacitor system;
wherein the silicon carbonitride-based layer of the self-supporting structural element is realized in the form of a silicon carbonitroboride layer $Si_{1-x-y-z}C_xN_yB_z$, with x, y, z being >1%.

7. A MEMS component, comprising:
a layer structure in which at least one self-supporting structural element having at least one electrode is realized, the self-supporting structural element being at least partially made up of a layer based on silicon carbonitride ($Si_{1-x-y}C_xN_y$), and at least one further electrode being developed in the layer structure, which forms a capacitor system together with the electrode of the self-supporting structural element, wherein at least one of the two electrodes of the capacitor system is supported so as to allow it to move, wherein the self-supporting structural element is used as one of a stationary carrier or stationary connection, for of at least one of the electrodes of the capacitor system;
wherein the self-supporting structural element is the stationary counterelement to one of a pressure-sensor diaphragm or a microphone diaphragm.

* * * * *